(12) United States Patent
Lee

(10) Patent No.: US 9,310,395 B2
(45) Date of Patent: Apr. 12, 2016

(54) PROBE MEMBER FOR POGO PIN

(71) Applicant: ISC CO., LTD., Jungwon-gu, Seongnam-si, Gyeonggi-do (KR)

(72) Inventor: Jae-Hak Lee, Seongnam-si (KR)

(73) Assignee: ISC CO., LTD., Seongnam-Si, Gyeonggi-Do ( * ) Notice: Subject to any disclaimer, the term of this patent is extended or adjusted under 35 U.S.C. 154(b) by 76 days.

(21) Appl. No.: 14/256,180

(22) Filed: Apr. 18, 2014

(65) Prior Publication Data
US 2014/0340106 A1 Nov. 20, 2014

(30) Foreign Application Priority Data
Apr. 18, 2013 (KR) .................. 10-2013-0043097

(51) Int. Cl.
*G01R 1/067* (2006.01)
*G01R 3/00* (2006.01)

(52) U.S. Cl.
CPC ........ *G01R 1/06722* (2013.01); *G01R 1/06738* (2013.01); *G01R 1/06716* (2013.01); *G01R 1/06733* (2013.01); *G01R 3/00* (2013.01)

(58) Field of Classification Search
CPC .. G01R 1/06722; G01R 3/00; G01R 1/06733; G01R 1/06738; G01R 1/06716
USPC ........................................ 324/755
See application file for complete search history.

(56) References Cited

U.S. PATENT DOCUMENTS

| | | | | |
|---|---|---|---|---|
| 5,557,213 A * | 9/1996 | Reuter | ............. | G01R 1/06722 324/755.05 |
| 6,396,293 B1 * | 5/2002 | Vinther | ............. | G01R 1/06722 324/755.05 |
| 6,524,115 B1 | 2/2003 | Gates et al. | | |
| 6,703,855 B1 * | 3/2004 | Wu | ............. | G01R 1/06722 324/755.05 |
| 7,271,015 B2 | 9/2007 | Okamoto et al. | | |
| 7,545,159 B2 * | 6/2009 | Winter | ............. | G01R 1/06733 324/755.05 |
| 7,956,627 B2 | 6/2011 | Kasukabe et al. | | |
| 2003/0222666 A1 | 12/2003 | Kagami | | |
| 2004/0232934 A1 * | 11/2004 | Sinclair | ............. | G01R 1/0466 324/755.05 |
| 2007/0128906 A1 | 6/2007 | Kazama et al. | | |
| 2008/0020498 A1 | 1/2008 | Okamoto et al. | | |
| 2008/0036484 A1 * | 2/2008 | Lee | ............. | G01R 1/06722 324/755.05 |
| 2008/0180125 A1 * | 7/2008 | Lee | ............. | G01R 1/06733 324/755.05 |
| 2009/0261851 A1 * | 10/2009 | Zhou | ............. | G01R 1/06738 324/755.05 |

(Continued)

FOREIGN PATENT DOCUMENTS

| | | |
|---|---|---|
| JP | H0555076 | 7/1993 |
| JP | H0712846 | 1/1995 |

(Continued)

OTHER PUBLICATIONS

Korean Notice of Allowance for Korean Application No. 10-2013-0043097, English translation attached to original, Dated Aug. 22, 2014, All together 7 Pages.

(Continued)

*Primary Examiner* — Jermele M Hollington
*Assistant Examiner* — Christopher McAndrew
(74) *Attorney, Agent, or Firm* — Brooks Kushman P.C.

(57) ABSTRACT

Provided is probe member for a pogo pin used for testing a semiconductor device, at least a portion of the probe member being inserted into a cylindrical body and supported by an elastic member and an upper end of the probe member contacting a terminal of the semiconductor device.

10 Claims, 10 Drawing Sheets

(56) References Cited

U.S. PATENT DOCUMENTS

| | | | |
|---|---|---|---|
| 2009/0291573 A1 | 11/2009 | Eldridge et al. | |
| 2011/0248736 A1* | 10/2011 | Kato | G01R 1/06722 324/755.05 |
| 2012/0105090 A1* | 5/2012 | Lee | G01R 1/06722 324/755.05 |
| 2012/0187971 A1* | 7/2012 | Huang | G01R 1/067 324/755.05 |
| 2012/0249174 A1* | 10/2012 | Suzuki | H01R 11/18 324/755.05 |
| 2013/0069684 A1* | 3/2013 | Jeong | G01R 1/06722 324/755.05 |
| 2015/0084658 A1 | 3/2015 | Lee | |

FOREIGN PATENT DOCUMENTS

| | | |
|---|---|---|
| JP | H0723284 | 4/1995 |
| JP | H09320715 | 12/1997 |
| JP | H10144438 | 5/1998 |
| JP | H11185912 | 7/1999 |
| JP | 2000123935 | 4/2000 |
| JP | 2000315556 | 11/2000 |
| JP | 2000329789 | 11/2000 |
| JP | 2001337128 | 12/2001 |
| JP | 2002334761 | 11/2002 |
| JP | 2003217774 | 7/2003 |
| JP | 2003344449 | 12/2003 |
| JP | 2008128882 | 6/2008 |
| JP | 2009031111 | 2/2009 |
| JP | 2009139191 | 6/2009 |
| JP | 2010159997 | 7/2010 |
| JP | 2012132717 | 7/2012 |
| JP | 2012181096 | 9/2012 |
| JP | 2014159517 | 9/2014 |
| JP | 2015116465 | 6/2015 |
| KR | 1020050087400 | 8/2005 |
| KR | 1020060127960 | 12/2006 |
| KR | 1020100005535 | 1/2010 |
| KR | 1020110127010 | 11/2011 |
| TW | 200532207 | 10/2005 |
| TW | 200912320 | 3/2009 |
| TW | I306948 | 3/2009 |
| TW | 201237422 | 9/2012 |
| WO | 2013162343 | 10/2013 |

OTHER PUBLICATIONS

Korean Notice of Non-Final Rejection for KR 10-2013-0043097, English Translation attached to original, Completed by the Korean Patent Office, Dated Apr. 14, 2014, All together 13 Pages.

Japanese Office Action for Japanese Application No. JP 2014-159499, Completed by the Japanese Patent Office, Date Jul. 28, 2015, 3 Pages.

* cited by examiner

PROBE MEMBER FOR POGO PIN

RELATED APPLICATION

This application claims the benefit of Korean Patent Application No. 10-2013-0043097, filed on Apr. 18, 2013, in the Korean Intellectual Property Office, the disclosure of which is incorporated herein in its entirety by reference.

BACKGROUND

1. Field

One or more embodiments of the present invention relate to a probe member for a pogo pin, and more particularly, to a probe member for a pogo pin that reliably contacts a terminal of a semiconductor device so as to be electrically connected well.

2. Description of the Related Art

Generally, in order to test electrical characteristics of semiconductor devices, a semiconductor device needs to have a stable electrical connection with a test device. Generally, a test socket is used as a device for the connection between the semiconductor device and the test device.

The test socket connects a terminal of the semiconductor device and a pad of the test device so that electrical signals may be exchanged bidirectionally. To this end, a pogo pin is used as a contacting unit in the test socket. The pogo pin includes a spring to easily connect the semiconductor device and the test device and to absorb a mechanical shock which may occur during the connection, and thus, it is used in most test sockets.

FIG. 1 schematically illustrates a general pogo pin.

A semiconductor device 1 that is a tested device includes an external connection terminal 2, and a test substrate 8 including a substrate pad 9 is disposed to correspond to the external connection terminal 2. In addition, a pogo pin 3 is located between the semiconductor device 1 and the test substrate 8 to electrically connect the semiconductor device 1 and the test substrate 8 to each other. In FIG. 1, a body of the test socket is omitted. As shown in FIG. 1, the pogo pin 3 includes an upper plunger 5 and a lower plunger 6 on opposite ends of a body 4, and a spring 7 is inserted into the body 4. Accordingly, the spring 7 applies an elastic force to the upper plunger 5 and the lower plunger 6 in a direction in which the upper and lower plungers 5 and 6 are apart from each other. Here, the upper plunger 5 is connected to the external connection terminal 2 of the semiconductor device 1, and the lower plunger 6 is connected to the substrate pad 9 of the test substrate 8. Accordingly, the external connection terminal 2 and the substrate pad 9 are electrically connected to each other. That is, when an end of the upper plunger 5 contacts the external connection terminal 2 of the semiconductor device 1 and an end of the lower plunger 6 contacts the substrate pad 9 of the test substrate 8, the external connection terminal 2 and the substrate pad 9 are electrically connected to each other.

Another conventional pogo pin is disclosed in Korean Patent Application No. 10-2011-0127010. In particular, FIGS. 2 and 3 illustrate a pogo pin for semiconductor testing that electrically connects a semiconductor device (not shown) to a test substrate (not shown) to test the semiconductor. The pogo pin includes a first plunger 20, a second plunger 30, and an elastic member 40. A movement space penetrated on two sides is formed in the first plunger 20. The second plunger 30 is formed of a conductive material. Also, the second plunger 30 is inserted into the movement space of the first plunger 20 so that an end of the second plunger 30 selectively protrudes over a contact exit 22' on a side of the movement space. The elastic member 40 is inserted between the first plunger 20 and the second plunger 30 to apply an elastic force in a direction in which the first plunger 20 and the second plunger 30 are apart from each other. An end of the second plunger 30 is connected to a substrate pad of the test substrate and the other end of the second plunger 30 is exposed outwards from the contact exit formed on one side of the movement space of the first plunger 20 by a relative movement of the first plunger 20 and the second plunger 30, to be connected to an external connection terminal of the semiconductor device.

The above-described pogo pins have the following problems.

Generally, the semiconductor device contacts the pogo pin by descending in a state in which the semiconductor device is inserted into a receiving socket. However, it is difficult for the terminal of the semiconductor device to be located at the center of the pogo pin, as the insert descends. In particular, recently, terminals of the semiconductor device tend to have small sizes and narrow distances among one another, and thus, it has become even more difficult for the center of the terminal of the semiconductor device to form an identical axis with the center of the pogo pin, as the semiconductor device descends.

If the terminal 2 of the semiconductor device 1 does not descend by forming an identical axis with the center of the first plunger 20 and descends while being deviated from the center of the first plunger 20 by a predetermined distance P in a horizontal direction, as shown in FIG. 4, the terminal 2 of the semiconductor device 1 may not reliably contact probe portions of the first plunger 20, as shown in FIG. 5. That is, even when the terminal 2 contacts the probe portions, the terminal 2 may not contact a plurality of probes and may contact only a portion of probes so that the contact performance is largely deteriorated.

When the contact between the pogo pin and the terminal of the semiconductor device is not solid, the reliability of a test result of the semiconductor device may become decreased.

PRIOR TECHNICAL REFERENCE

Patent Reference

Korean Patent Application No. 10-2011-0127010

SUMMARY

One or more embodiments of the present invention include a probe member for a pogo pin which enables a solid contact between the pogo pin and a terminal of a semiconductor device even when the terminal of the semiconductor device does not descend at the center of the pogo pin.

Additional aspects will be set forth in part in the description which follows and, in part, will be apparent from the description, or may be learned by practice of the presented embodiments.

According to one or more embodiments of the present invention, a probe member for a pogo pin used for testing a semiconductor device, at least a portion of the probe member being inserted into a cylindrical body and supported by an elastic member and an upper end of the probe member contacting a terminal of the semiconductor device, includes: a probe portion, in an upper end of which a plurality of probes contacting the terminal of the semiconductor device are formed; and a combining portion that extends downwards from the probe portion and is inserted into the cylindrical body to be combined with the cylindrical body, wherein the probes include a plurality of first probes arranged at a center and contacting the terminal of the semiconductor device and a second probe disposed adjacent to the first probes and including a guide surface to guide the terminal of the semiconductor device contacting the second probe toward the first probes.

A protrusion height of the second probe may be greater than a protrusion height of the first probes.

The second probe may be arranged such that a pair of second probes are arranged to face each other with the first probes between the pair of second probes.

The second probe may be disposed in an upper edge of the probe portion.

A third probe which has a protrusion height that is greater than a protrusion height of the first probes and smaller than a protrusion height of the second probe may be arranged between the first probes and the second probe.

The second probe may have a cross-sectional shape of a right triangle.

According to one or more embodiments of the present invention, a probe member for a pogo pin used for testing a semiconductor device, at least a portion of the probe member being inserted into a cylindrical body and an upper end of the probe member contacting a terminal of the semiconductor device, includes: a probe portion, in an upper end of which a plurality of probes contacting the terminal of the semiconductor device are formed; and a combining portion that extends downwards from the probe portion and is inserted into the cylindrical body to be combined with the cylindrical body, wherein the probes include a plurality of first probes arranged at an upper center of the probe portion and contacting the terminal of the semiconductor device and a second probe arranged in an upper edge of the probe portion and having a protrusion height that is greater than a protrusion height of the first probes.

The second probe may be arranged such that a pair of second probes are arranged to face each other with the first probes between the pair of second probes.

A third probe which has a protrusion height that is greater than the protrusion height of the first probes and smaller than the protrusion height of the second probe may be arranged between the first probes and the second probe.

The second probe may have a cross-sectional shape of a right triangle.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
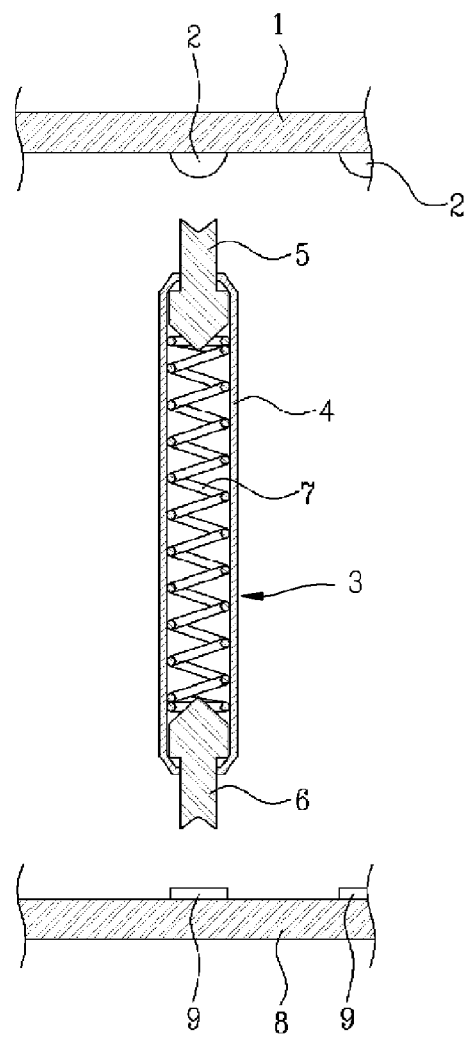
FIG. 1 is a schematic view of a general pogo pin.
Figure 2:
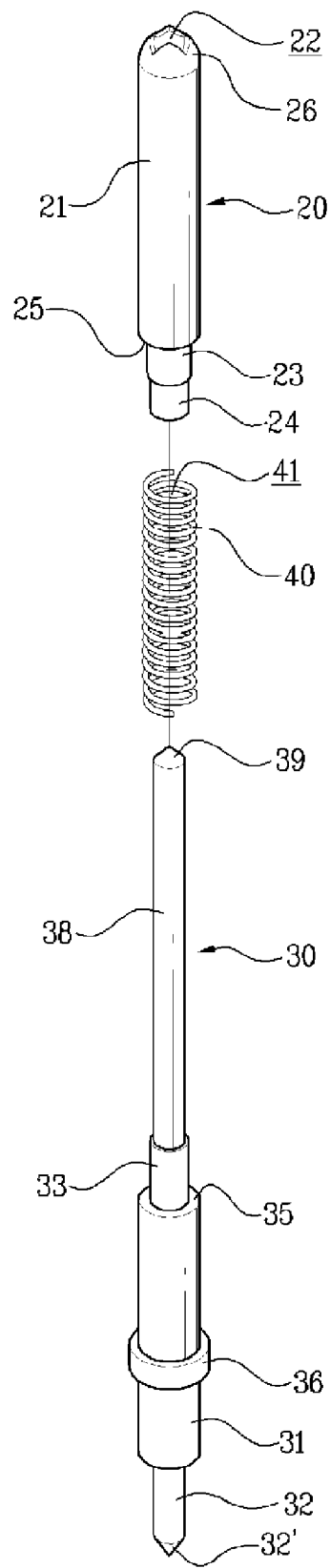
FIG. 2 is an exploded perspective view of a general pogo pin.
Figure 3:
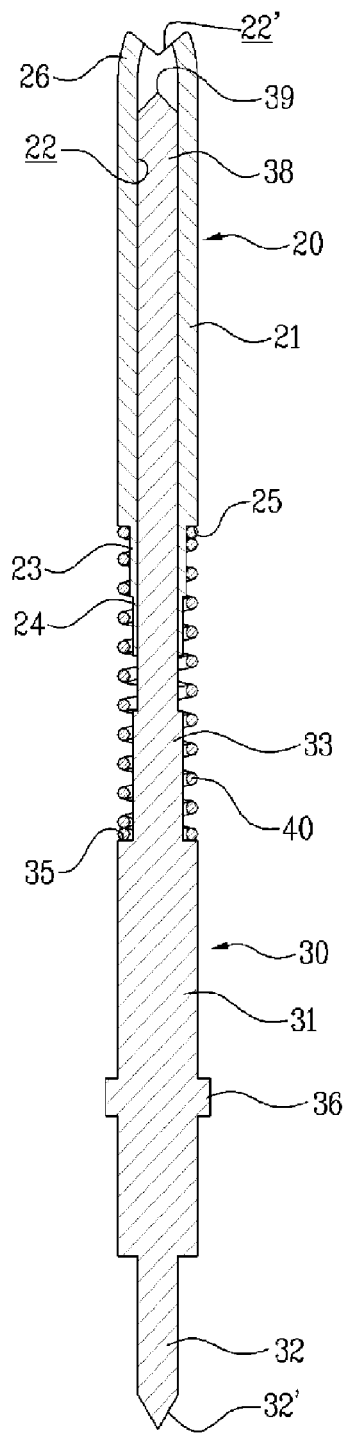
FIG. 3 is a cross sectional view of FIG. 2.
Figure 4:
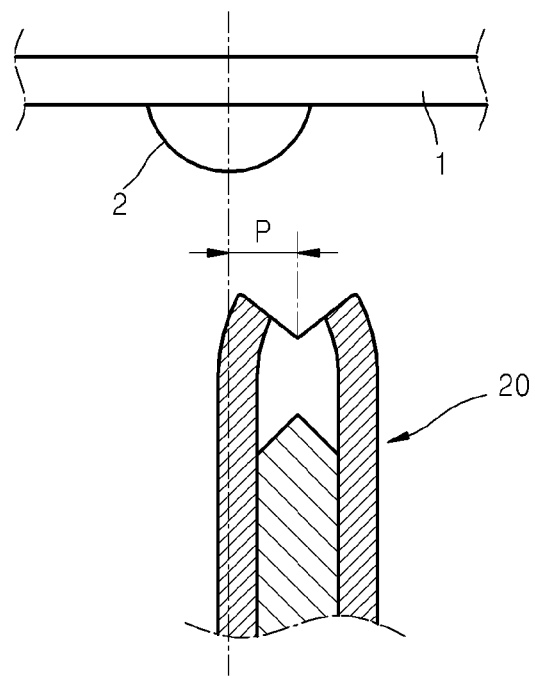
FIGS. 4 and 5 are diagrams for explaining operation of a general pogo pin.
Figure 5:
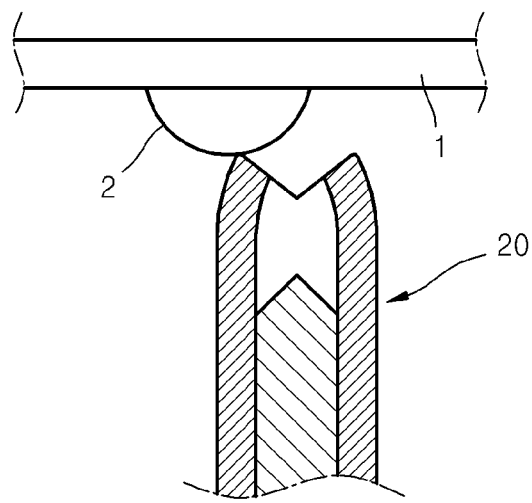
Figure 6:
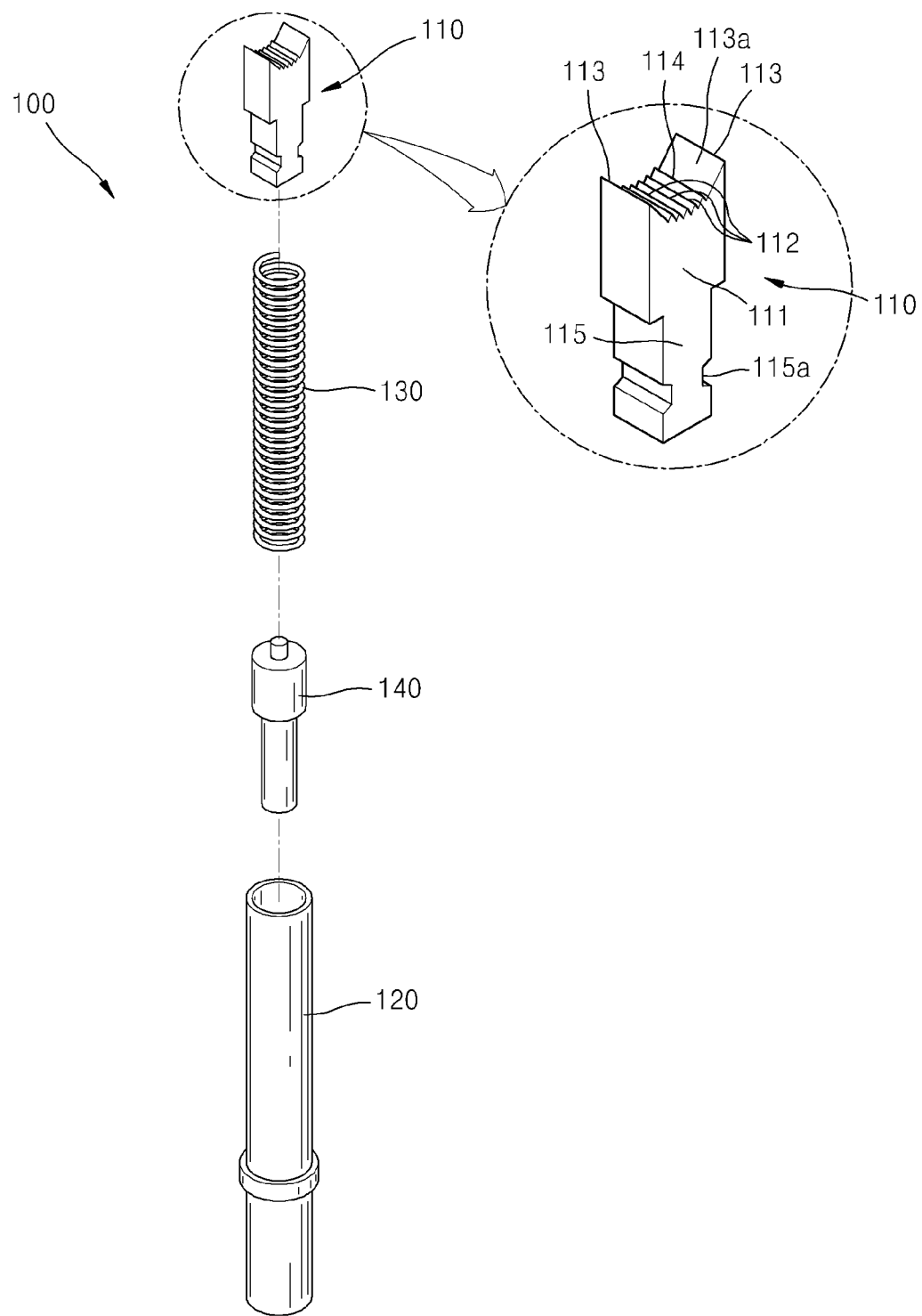
FIG. 6 is a perspective view of a pogo pin including a probe member for a pogo pin according to an embodiment of the present invention.
Figure 7:
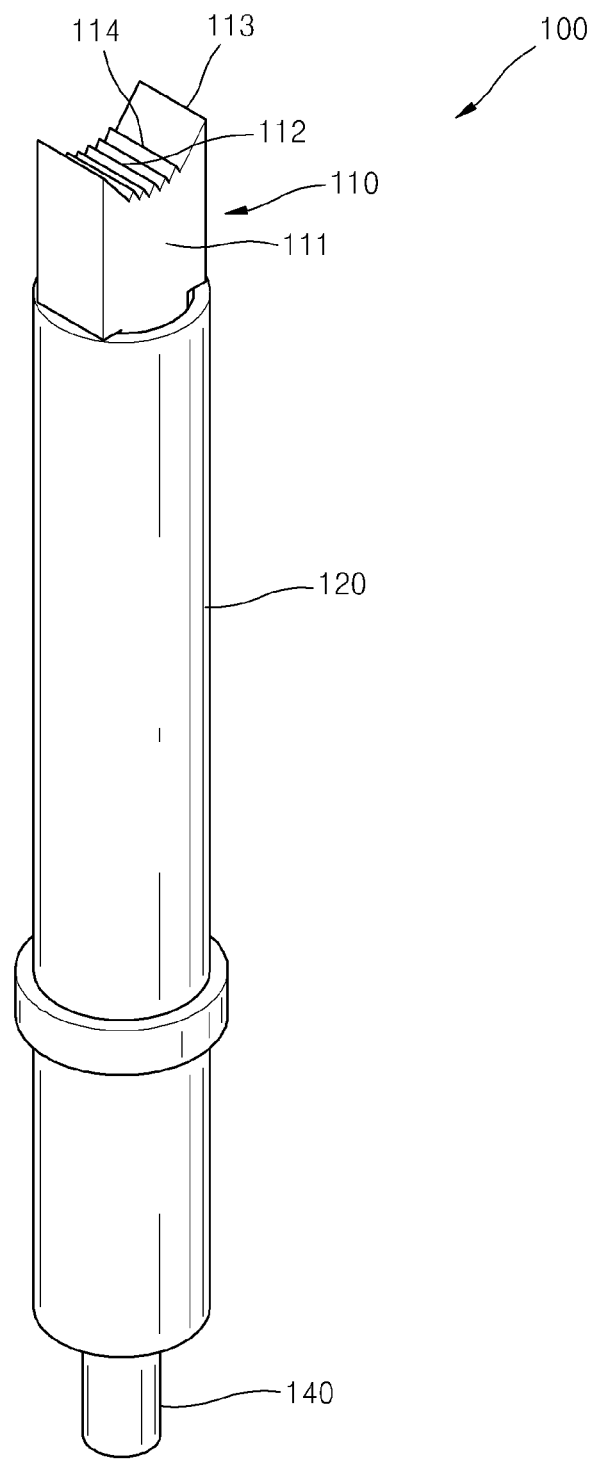
FIG. 7 is a combined perspective view of FIG. 6.

Hereinafter, a probe member for a pogo pin according to an embodiment of the present invention will be described in detail with reference to attached drawings.

The probe member for the pogo pin 110 according to the present embodiment is used for testing a semiconductor device 150. At least a portion of the probe member for the pogo pin 110 is inserted into a cylindrical body 120 to be supported by an elastic member 130, and an upper end of the probe member for the pogo pin 110 contacts a terminal 151 of the semiconductor device 150.

The probe member for the pogo pin 110 is formed of a probe portion 111 and a combining portion 115.

The probe portion 111 includes a plurality of probes contacting the terminal 151 of the semiconductor device 150, in an upper end thereof. Here, the probes include first probes 112 and a second probe 113.

The first probes 112 are arranged at a center of the upper end of the probe portion 111. The first probes 112 are arranged in a horizontal direction, each of the first probes 112 having substantially the same height. It is desired that each of the first probes 112 have an approximately triangular shape. However, it is not limited thereto, and each of the first probes 112 may have various shapes, such as trapezoidal or quadrangular shapes. The first probes 112 extend in the horizontal direction, each of the first probes 112 having a triangular cross-sectional shape.

The first probes 112 may be formed of a nickel alloy material, which is solid and has excellent electrical conductivity. That is, the first probes 112 may be formed of nickel-cobalt, however, it is not limited thereto. The first probes 112 may be formed of various materials, according to necessity.

The second probe 113 is arranged adjacent to the first probes 112. The second probe 113 includes a guide surface 113a that may guide the terminal 151 of the semiconductor device 150, which contacts the second probe 113, toward the first probes 112. The guide surface 113a may have a slope shape tapered toward the first probes 112.

Here, a protrusion height s2 of the second probe 113 is greater than a protrusion height s1 of the first probes 112. Also, the second probe 113 may be arranged such that a pair of second probes 113 are disposed to face each other with the first probes 112 therebetween. The pair of second probes 113 are arranged in an upper edge of the probe portion 111.

The second probes 113 may have a cross-sectional shape of a right triangle since the guide surface 113a that is sloped is arranged to face the first probes 112 and the exterior surface has a vertical shape. The second probes 113 are extended in a horizontal direction. That is, the second probes 113 are extended in the same direction as the first probes 112.

Meanwhile, a third probe 114 having a protrusion height s3 which is greater than the protrusion height s1 of the first probes 112 and smaller than the protrusion height s2 of the second probe 113, may be disposed between the first probes 112 and the second probe 113.

The combining portion 115 extends downwards from the probe portion 111 and is inserted into the cylindrical body 120 to be combined with the cylindrical body 120.

The combining portion 115 includes a concave portion 115a which is concave toward the inside, and, a portion of the cylindrical body 120 is retracted toward the inside in correspondence to the concave portion 115a so as to fixedly combine the combining portion 115 to the cylindrical body 120.

Meanwhile, a structure of a pogo pin 100 including the probe member for the pogo pin 110 according to the present embodiment is as described below. The pogo pin 100 includes the probe member for the pogo pin 110, the cylindrical body 120, an elastic member 130 disposed inside the cylindrical body 120 and elastically biasing the probe member for the pogo pin 110 toward an upper side, and a lower probe member 110, at least a portion of which protrudes through a lower opening of the cylindrical body 120 and which is supported by the elastic member 130. Here, the pogo pin 100 is inserted into a housing (not shown) including openings in upward and downward directions.

An operational effect of the probe member for the pogo pin 100 according to the present embodiment will now be described.

Figure 8:
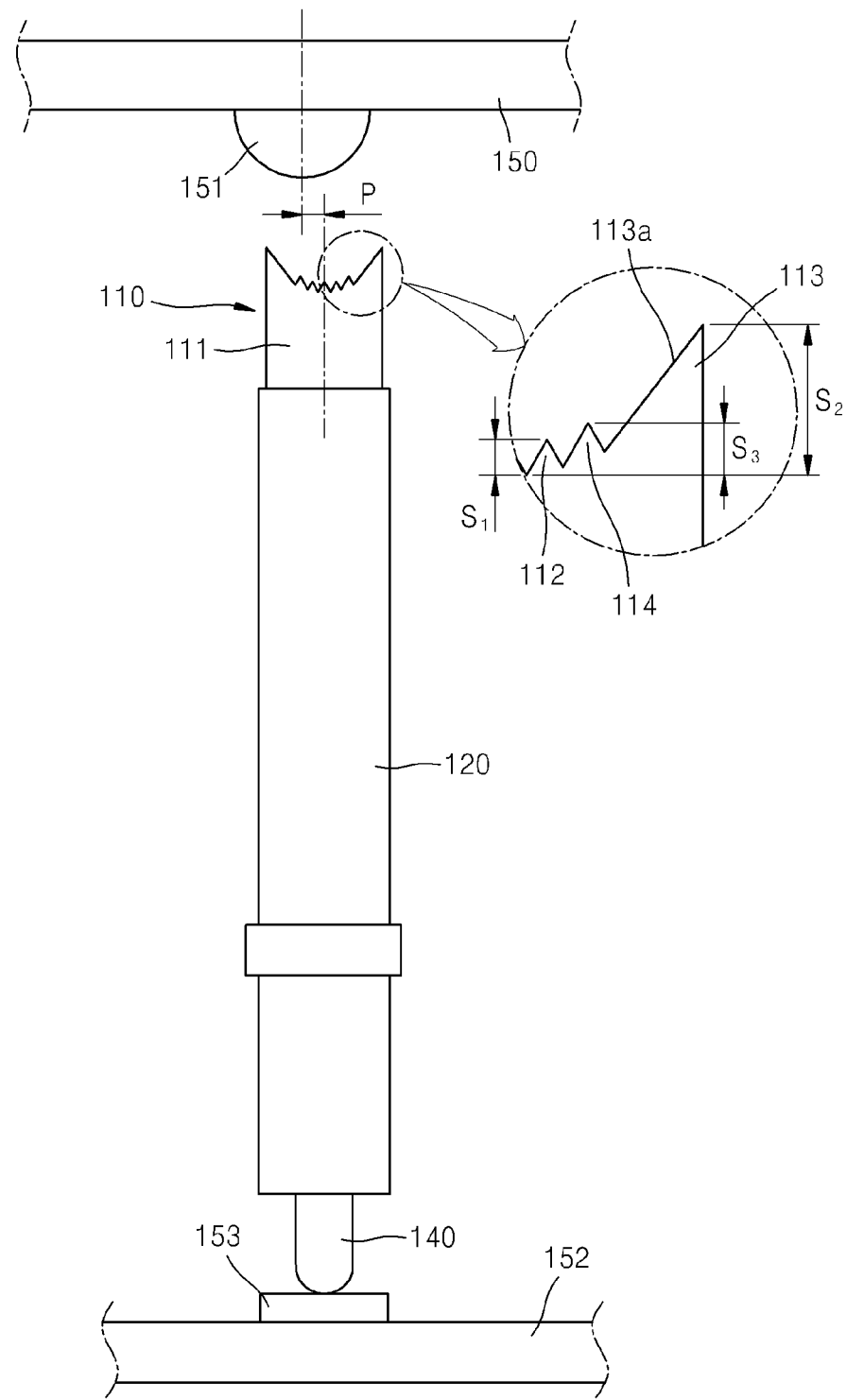
FIGS. 8 through 10 are diagrams for explaining operation of the pogo pin of FIG. 6.
Figure 9:
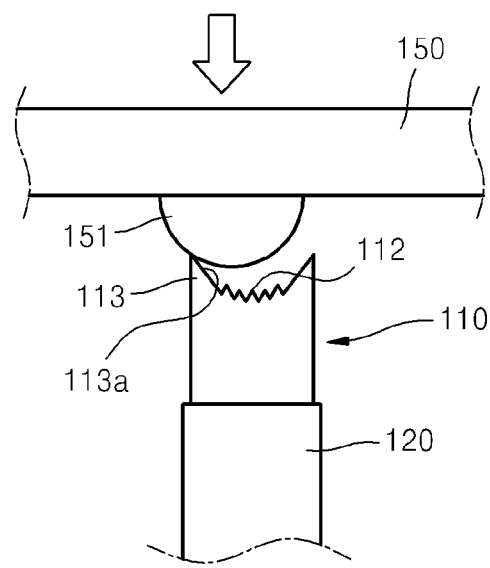
Figure 10:
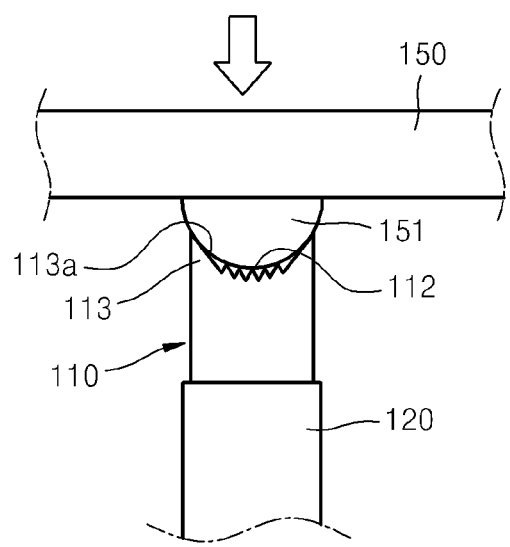
Figure 11:
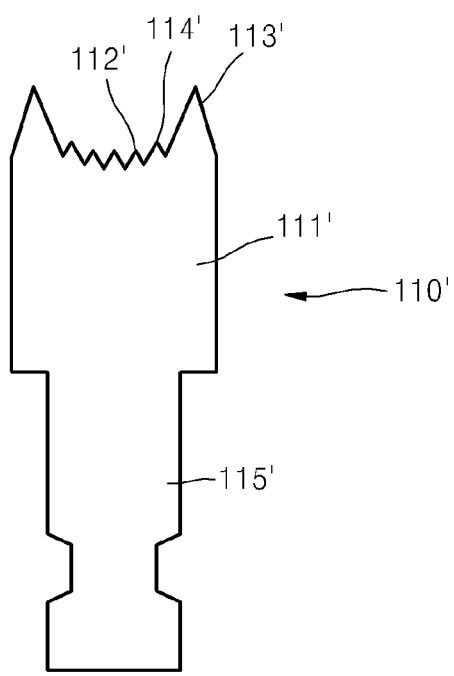
FIG. 11 is a view of a probe member for a pogo pin according to another embodiment of the present invention.

First, when the terminal 151 of the semiconductor device 150 descends in a state in which the center of the terminal 151 of the semiconductor device 150 does not correspond to the center of the probe member for the pogo pin 110, deviating from the center of the probe member for the pogo pin 110 in a horizontal direction, as shown in FIG. 8, the terminal 151 of the semiconductor device 150 first contacts the second probe 113, as shown in FIG. 9. Here, when the terminal 151 of the semiconductor device 150 further descends, the terminal 151 of the semiconductor device 150 is guided toward the center of the probe portion 111 along the guide surface 113a of the second probe 113, and, accordingly, the terminal 151 of the semiconductor device 150 may reliably contact the first probes 112 disposed at the upper center of the probe portion 111, as shown in FIG. 10. Here, the first probes 112 include a plurality of projections so that the terminals 151 of the semiconductor device 150 reliably contact the plurality of probes.

As described above, according to the probe member for the pogo pin 110 according to the present embodiment, the terminal 151 of the semiconductor device 150 is guided toward the center of the pogo pin 100 to contact the plurality of first probes 112, even when the terminal 151 of the semiconductor device 150 descends in a state in which the terminal 151 of the semiconductor device 150 deviates from the center of the pogo pin 100 in the horizontal direction. Thus, the terminal 151 of the semiconductor device 150 may reliably contact a plurality of contact points, thereby ensuring the reliability of the test.

Figure 12:
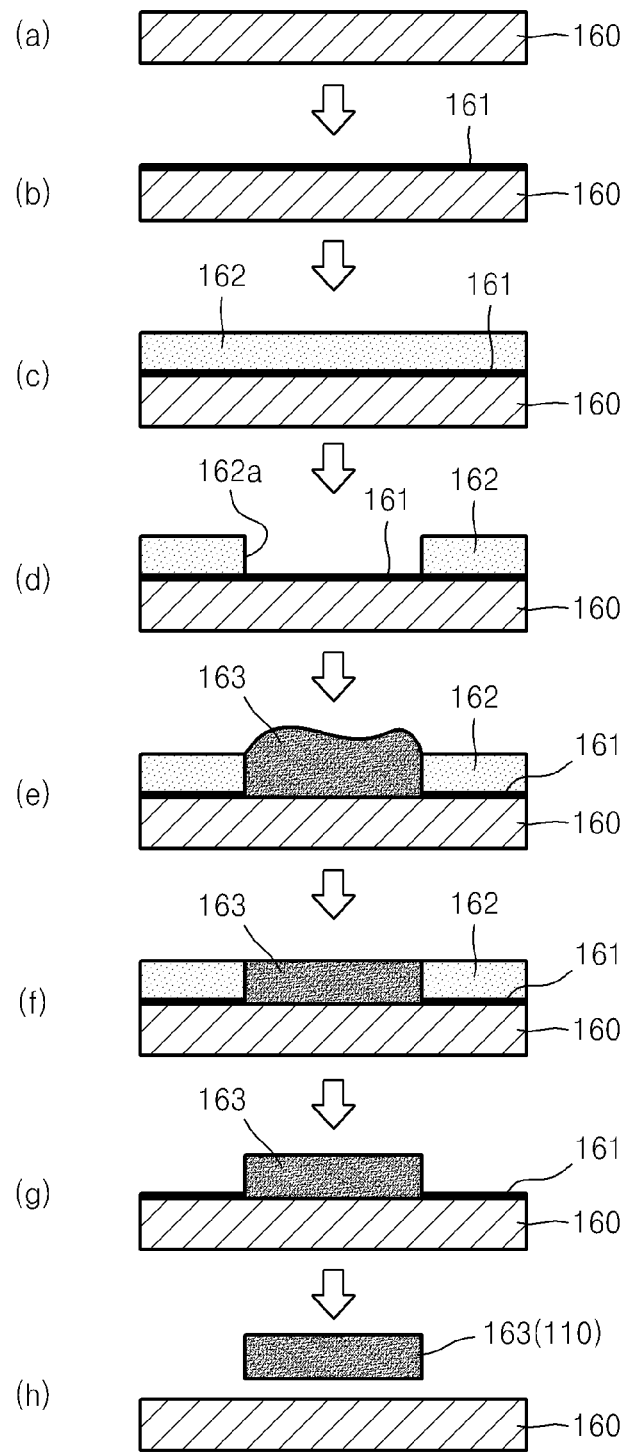
FIG. 12 is a view illustrating a method of manufacturing a probe member for a pogo pin according to embodiments of the present invention.

The probe member for the pogo pin 110 according to the present embodiment may be manufactured as illustrated in FIG. 12.

First, a substrate 160 formed of a silicon material is prepared, as illustrated in FIG. 12A. A conductive layer 161 is formed on an upper surface of the substrate 160, as illustrated in FIG. 12B. A dry film 162 is disposed on the conductive layer 161, as illustrated in FIG. 12C. A predetermined groove 162a is formed in the dry film 162, as illustrated in FIG. 12D. Here, the groove 162a has a shape corresponding to a shape of the probe member for the pogo pin 110 that is being manufactured. Next, a plating layer 163 is formed by adopting a plating material in the groove 162a formed by the dry film 162, as illustrated in FIG. 12E. Then, a planarization operation is performed as illustrated in FIG. 12F. After that, the dry film 162 formed on the substrate 160 is removed, as illustrated in FIG. 12G. Finally, the probe member 110 that is manufactured is removed from the substrate 160, as illustrated in FIG. 12H.

The probe member for the pogo pin 110 is not limited to the above described shape, and may be realized having various shapes. In particular, a second probe 113' disposed around first probes 112' may be formed to have a shape of an isosceles triangle, instead of the right triangle.

As described above, according to the one or more of the above embodiments of the present invention, the probe member for the pogo pin includes the second probe that guides the terminal of the semiconductor device descending around the first probes arranged in the center of the probe portion, toward the first probes. Therefore, the terminal of the semiconductor device may reliably contact the pogo pin.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. A probe member for a pogo pin used for testing a semiconductor device, with a first end and at least part of a middle portion of the probe member telescopically cooperating with a cylindrical body and supported by an elastic member, and an upper second end of the probe member for contacting a terminal of the semiconductor device to be tested, the probe member comprising:
an elongate body having a first end, a spaced apart second end and a middle portion aligned along an common axis;
wherein the upper second end of the elongate body is provided with a plurality of first projections adjacent the axis for contacting the terminal of the semiconductor device to be tested and a plurality of second projections located radially outboard of the first projections and spaced about the axis; and
wherein the plurality of first projections provide contact with the terminal of the semiconductor device during testing and the second projections have an inwardly sloped guide surfaces to guide the terminal of the semiconductor device toward the first projections during installation.

2. The probe member of claim 1, wherein a protrusion height of the second projections is greater than a protrusion height of the first projections.

3. The probe member of claim 1, wherein the second projections are arranged such that a pair of second projections are arranged to face each other with the first projections between the pair of second projections.

4. The probe member of claim 1, wherein the second projections are disposed in an upper edge of the elongate body first end.

5. The probe member of claim 2, wherein a third projection which has a protrusion height that is greater than a protrusion height of the first projections and smaller than a protrusion height of the second projections is arranged between the first projections and the second projections.

6. The probe member of claim 1, wherein the second projections has a cross-sectional shape of a right triangle.

7. A probe member for a pogo pin used for testing a semiconductor device, at least a portion of the probe member being inserted into a cylindrical body and an upper end of the probe member contacting a terminal of the semiconductor device, the probe member comprising:

a probe portion, in an upper end of which a plurality of probes contacting the terminal of the semiconductor device are formed; and a combining portion that extends downwards from the probe portion and is inserted into the cylindrical body to be combined with the cylindrical body, wherein the probes comprise a plurality of first probes arranged at an upper center of the probe portion and contacting the terminal of the semiconductor device and a second probe arranged in an upper edge of the probe portion and having a protrusion height that is greater than a protrusion height of the first probes.

8. The probe member of claim 7, wherein the second probe is arranged such that a pair of second probes are arranged to face each other with the first probes between the pair of second probes.

9. The probe member of claim 7, wherein a third probe which has a protrusion height that is greater than the protrusion height of the first probes and smaller than the protrusion height of the second probe is arranged between the first probes and the second probe.

10. The probe member of claim 7, wherein the second probe has a cross-sectional shape of a right triangle.

\* \* \* \* \*